US011341399B2

(12) United States Patent
Ambardekar et al.

(10) Patent No.: US 11,341,399 B2
(45) Date of Patent: May 24, 2022

(54) REDUCING POWER CONSUMPTION IN A NEURAL NETWORK PROCESSOR BY SKIPPING PROCESSING OPERATIONS

(71) Applicant: Microsoft Technology Licensing, LLC, Redmond, WA (US)

(72) Inventors: Amol Ashok Ambardekar, Redmond, WA (US); Chad Balling McBride, North Bend, WA (US); George Petre, Redmond, WA (US); Larry Marvin Wall, Seattle, WA (US); Kent D. Cedola, Bellevue, WA (US); Boris Bobrov, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1045 days.

(21) Appl. No.: 15/953,195

(22) Filed: Apr. 13, 2018

(65) Prior Publication Data
US 2018/0300605 A1    Oct. 18, 2018

Related U.S. Application Data

(60) Provisional application No. 62/486,432, filed on Apr. 17, 2017.

(51) Int. Cl.
*G06N 3/063*    (2006.01)
*G06N 3/04*    (2006.01)
(Continued)

(52) U.S. Cl.
CPC .............. *G06N 3/063* (2013.01); *G06F 1/324* (2013.01); *G06F 1/3275* (2013.01);
(Continued)

(58) Field of Classification Search
CPC ............ G06N 3/063; G06N 3/04; G06N 3/08; G06N 3/10; G06F 9/3832; G06F 17/16
See application file for complete search history.

(56) References Cited

U.S. PATENT DOCUMENTS 4,298,954 A    11/1981  Bigelow et al.
5,091,864 A     2/1992  Baji et al.
(Continued)

FOREIGN PATENT DOCUMENTS

EP    0147857 A2    7/1985
EP    2945290 A2    11/2015
(Continued)

OTHER PUBLICATIONS

Nurvitadhi, Eriko, Asit Mishra, and Debbie Marr. "A sparse matrix vector multiply accelerator for support vector machine." 2015 International Conference on Compilers, Architecture and Synthesis for Embedded Systems (CASES). IEEE, 2015. (Year: 2015).*
(Continued)

*Primary Examiner* — Benjamin P Geib
(74) *Attorney, Agent, or Firm* — Leonard J. Hope; Newport IP, LLC

(57) ABSTRACT

A deep neural network ("DNN") module can determine whether processing of certain values in an input buffer or a weight buffer by neurons can be skipped. For example, the DNN module might determine whether neurons can skip the processing of values in entire columns of a neuron buffer. Processing of these values might be skipped if an entire column of an input buffer or a weight buffer are zeros, for example. The DNN module can also determine whether processing of single values in rows of the input buffer or the weight buffer can be skipped (e.g. if the values are zero). Neurons that complete their processing early as a result of skipping operations can assist other neurons with their processing. A combination operation can be performed
(Continued)

following the completion of processing that transfers the results of the processing operations performed by a neuron to their correct owner.

10 Claims, 9 Drawing Sheets

(51) Int. Cl.
| | |
|---|---|
| G06N 3/08 | (2006.01) |
| G06N 3/10 | (2006.01) |
| G06F 12/0862 | (2016.01) |
| G06F 9/46 | (2006.01) |
| G06F 1/324 | (2019.01) |
| G06F 3/06 | (2006.01) |
| G06F 9/38 | (2018.01) |
| G06F 12/08 | (2016.01) |
| G06F 12/10 | (2016.01) |
| G06F 15/80 | (2006.01) |
| G06F 17/15 | (2006.01) |
| G06N 3/06 | (2006.01) |
| H03M 7/30 | (2006.01) |
| H04L 45/00 | (2022.01) |
| H04L 67/02 | (2022.01) |
| H04L 67/1001 | (2022.01) |
| G06F 9/30 | (2018.01) |
| G06F 13/16 | (2006.01) |
| G06F 1/3234 | (2019.01) |
| G06F 12/02 | (2006.01) |
| G06F 13/28 | (2006.01) |
| H03M 7/46 | (2006.01) |
| H04L 45/50 | (2022.01) |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | |
|---|---|---|
| 5,487,153 A | 1/1996 | Hammerstrom et al. |
| 5,524,175 A | 6/1996 | Sato et al. |
| 5,644,749 A | 7/1997 | Obayashi |
| 5,859,990 A | 1/1999 | Yarch |
| 5,933,654 A | 8/1999 | Galdun et al. |
| 6,307,867 B1 | 10/2001 | Roobol et al. |
| 6,654,730 B1 | 11/2003 | Kato et al. |
| 6,785,239 B1 | 8/2004 | Tasker |
| 6,990,079 B2 | 1/2006 | Vrabel |
| 7,012,893 B2 | 3/2006 | Bahadiroglu |
| 7,480,640 B1 | 1/2009 | Elad et al. |
| 7,539,608 B1 | 5/2009 | Dageville et al. |
| 7,694,084 B2 | 4/2010 | Raghavan et al. |
| 8,244,953 B1 | 8/2012 | Kumar |
| 8,442,927 B2 | 5/2013 | Chakradhar et al. |
| 8,892,488 B2 | 11/2014 | Qi et al. |
| 8,966,413 B2 | 2/2015 | Shacham et al. |
| 9,015,096 B2 | 4/2015 | Hunzinger |
| 9,143,393 B1 | 9/2015 | Bird et al. |
| 9,378,044 B1 | 6/2016 | Gaurav et al. |
| 9,851,771 B2 | 12/2017 | Cooper et al. |
| 9,990,307 B1 | 6/2018 | Patel et al. |
| 10,275,001 B2 | 4/2019 | Kam et al. |
| 2002/0133648 A1 | 9/2002 | Goudie et al. |
| 2003/0065631 A1 | 4/2003 | Mcbride |
| 2003/0120799 A1 | 6/2003 | Lahav et al. |
| 2003/0200315 A1 | 10/2003 | Goldenberg et al. |
| 2004/0187135 A1 | 9/2004 | Pronovost et al. |
| 2005/0204189 A1 | 9/2005 | Akiba |
| 2005/0216616 A1 | 9/2005 | Eldar et al. |
| 2006/0047864 A1 | 3/2006 | Brokenshire et al. |
| 2007/0145151 A1 | 6/2007 | Nakamura et al. |
| 2008/0043742 A1 | 2/2008 | Pong et al. |
| 2008/0052441 A1 | 2/2008 | Freking et al. |
| 2008/0112438 A1 | 5/2008 | Ying et al. |
| 2008/0313385 A1 | 12/2008 | Vijayakumar et al. |
| 2008/0319933 A1 | 12/2008 | Moussa et al. |
| 2009/0037697 A1 | 2/2009 | Ramani et al. |
| 2009/0313195 A1 | 12/2009 | McDaid et al. |
| 2010/0180100 A1 | 7/2010 | Lu et al. |
| 2010/0257174 A1 | 10/2010 | Minuti |
| 2010/0281192 A1 | 11/2010 | Rakib et al. |
| 2011/0246722 A1 | 10/2011 | Taha et al. |
| 2012/0130928 A1 | 5/2012 | Bell et al. |
| 2012/0134449 A1 | 5/2012 | Chen et al. |
| 2014/0046882 A1 | 2/2014 | Wood |
| 2014/0181464 A1 | 6/2014 | Forsyth et al. |
| 2014/0281221 A1 | 9/2014 | Wang et al. |
| 2014/0372670 A1 | 12/2014 | Vasilyuk |
| 2015/0363239 A1 | 12/2015 | Hsu et al. |
| 2016/0098388 A1 | 4/2016 | Blevins et al. |
| 2016/0184587 A1 | 6/2016 | Heuvel et al. |
| 2016/0267377 A1 | 9/2016 | Pan et al. |
| 2016/0328644 A1 | 11/2016 | Lin et al. |
| 2016/0335119 A1 | 11/2016 | Merrill et al. |
| 2016/0350653 A1 | 12/2016 | Socher et al. |
| 2016/0358069 A1* | 12/2016 | Brothers ................ G06F 7/764 |
| 2017/0011288 A1 | 1/2017 | Brothers et al. |
| 2017/0199902 A1 | 7/2017 | Mishra et al. |
| 2018/0164866 A1* | 6/2018 | Turakhia ................ G06N 3/063 |
| 2018/0218518 A1* | 8/2018 | Yan ........................ G06N 3/063 |
| 2018/0299943 A1 | 10/2018 | Mcbride et al. |
| 2018/0300601 A1 | 10/2018 | Cedola et al. |
| 2018/0300602 A1 | 10/2018 | Petre et al. |
| 2018/0300603 A1 | 10/2018 | Ambardekar et al. |
| 2018/0300604 A1 | 10/2018 | Mcbride et al. |
| 2018/0300606 A1 | 10/2018 | Corkery et al. |
| 2018/0300607 A1 | 10/2018 | Petre et al. |
| 2018/0300613 A1 | 10/2018 | Petre et al. |
| 2018/0300614 A1 | 10/2018 | Ambardekar et al. |
| 2018/0300615 A1 | 10/2018 | Ambardekar et al. |
| 2018/0300616 A1 | 10/2018 | Ambardekar et al. |
| 2018/0300617 A1 | 10/2018 | Mcbride et al. |
| 2018/0300633 A1 | 10/2018 | Mcbride et al. |
| 2018/0300634 A1 | 10/2018 | Mcbride et al. |
| 2020/0233820 A1 | 7/2020 | Mcbride et al. |

FOREIGN PATENT DOCUMENTS

| | | |
|---|---|---|
| EP | 3035204 A1 | 6/2016 |
| EP | 3035249 A1 | 6/2016 |
| WO | 1993014459 A1 | 7/1993 |
| WO | 2016118257 A1 | 7/2016 |
| WO | 2016210030 A1 | 12/2016 |

(56) References Cited

OTHER PUBLICATIONS

"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Non Final Office Action Issued in U.S. Appl. No. 15/702,311", dated May 21, 2019, 12 Pages.
"Ex Parte Quayle Action Issued in U.S. Appl. No. 15/950,644", dated Sep. 23, 2019, 7 Pages.
Chi, et al., "Prime: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.
"Non Final Office Action Issued In U.S. Appl. No. 15/702,311", dated Jun. 29, 2018, 10 Pages.
"International Search Report and Written Opinion Issued In PCT Application No. PCT/US2018/026358", dated Jul. 11, 2018, 15 Pages.
"International Search Report and Written Opinion Issued In PCT Application No. PCT/US2018/026352", dated Jun. 27, 2018, 11 Pages.
"International Search Report and Written Opinion Issued In PCT Application No. PCT/US2018/026353", dated Jul. 6, 2018, 15 Pages.
"International Search Report and Written Opinion Issued In PCT Application No. PCT/US2018/026354", dated Jul. 31, 2018, 15 Pages.
"International Search Report and Written Opinion Issued In PCT Application No. PCT/US2018/026355", dated Jul. 9, 2018, 16 Pages.
"International Search Report and Written Opinion Issued In PCT Application No. PCT/US2018/026356", dated Jul. 6, 2018, 16 Pages.
"International Search Report and Written Opinion Issued In PCT Application No. PCT/US2018/026357", dated Jul. 9, 2018, 16 Pages.
"Notice of Allowance Issued in U.S. Appl. No. 15/702,311", dated Sep. 11, 2019, 6 Pages.
Sze, et al., Efficient Processing of Deep Neural Networks: A Tutorial and Survey, arXiv:1703.0990392v2[cs.CV] Aug. 13, 2017, 32 pages.
"Notice of Allowance Issued in U.S. Appl. No. 15/694,663", dated May 8, 2020, 9 Pages.
"Office Action Issued in Indian Patent Application No. 201947035666", dated Feb. 2, 2022, 7 Pages.

\* cited by examiner

FIG. 3 FULL-COLUMN OPERATION SKIPPING

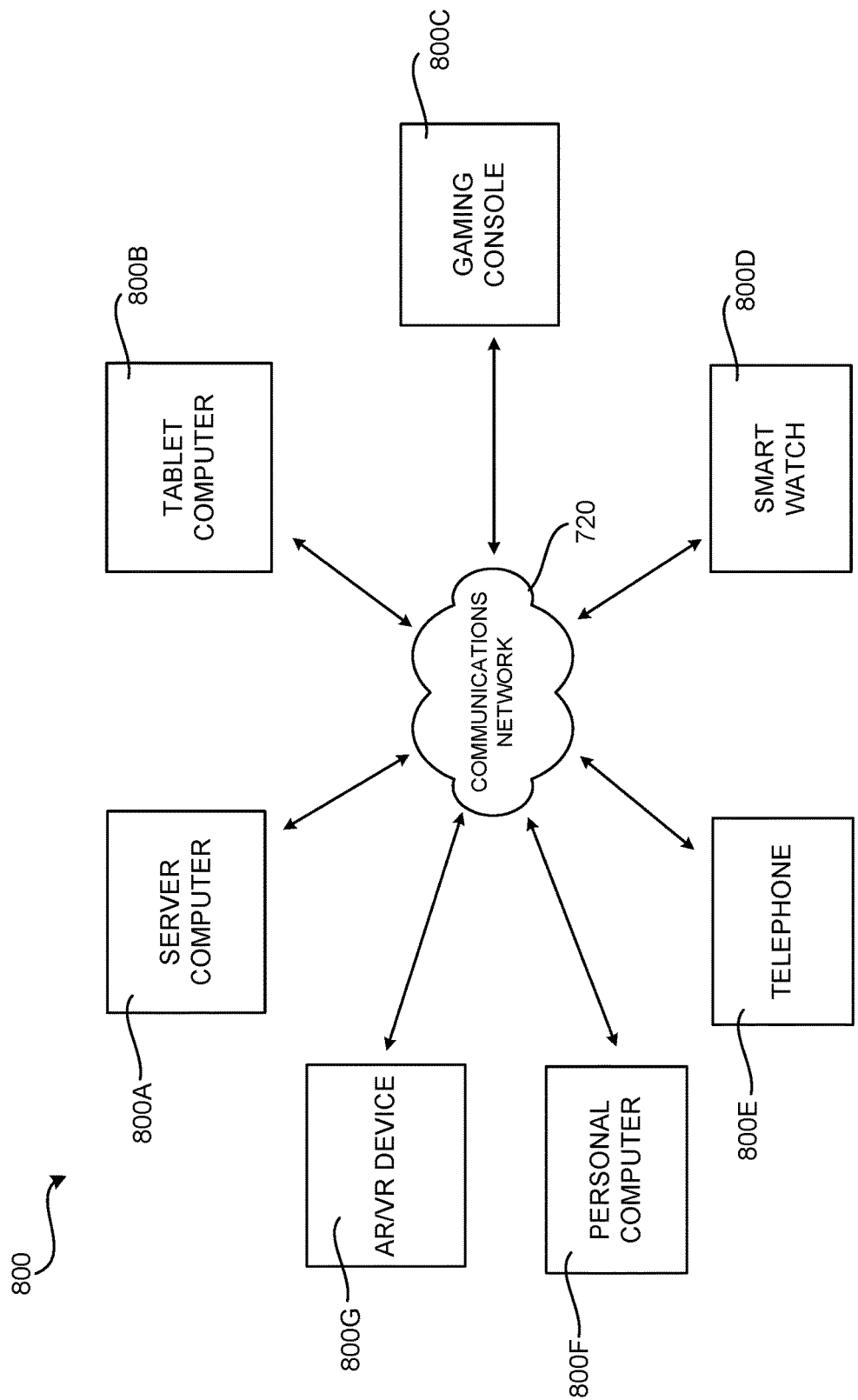

REDUCING POWER CONSUMPTION IN A NEURAL NETWORK PROCESSOR BY SKIPPING PROCESSING OPERATIONS

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power, and reducing the power consumption of POE devices like security cameras permits the use of POE switches that provide less power.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

It is with respect to these and other technical challenges that the disclosure made herein is presented.

SUMMARY

A neural network module, or processor, is disclosed herein that can improve throughput and reduce power consumption by skipping the performance of certain types of neural network processing operations. More particularly, the neural network module disclosed herein can skip arithmetic operations performed on input data and weight data, or other types of data, under certain conditions, thereby improving throughput and saving power as compared to previous hardware neural network processors. Other technical benefits not specifically mentioned herein can also be realized through implementations of the disclosed subject matter.

In order to realize the technical benefits mentioned briefly above, a DNN module is provided that includes neurons and a neuron buffer. The neuron buffer stores an input buffer that contains input data to a neural network and a weight buffer that stores weights defining aspects of a neural network. The input data in the input buffer and the weight data in the weight buffer can be organized into corresponding rows and columns. The input buffer and weight buffer can be implemented in hardware in different ways in different embodiments.

In one embodiment, the DNN module provides functionality for full-column operation skipping. In this embodiment, the neurons in the DNN module operate synchronously. Each column of data in the input buffer and weight buffer is data that is to be fed to all neurons in a single clock cycle. Rows include the data that is provided to each neuron. Columns of the input buffer and the weight buffer are matched. That is, if processing of a column of the input buffer is skipped, processing of the corresponding column of the weight buffer is also skipped and vice-versa.

In order to perform column-wise operation skipping, the DNN module can determine whether the values in an entire column of the input buffer or an entire column of the weight buffer are a particular value or within a range of values. For example, in one specific embodiment, a group partitioner and scheduler in the DNN module determines if all of the values in an entire column of the input buffer are zero. This might occur, for instance, during a convolution operation where a zero input value or weight value would result in a wasted processing cycle.

If the values in any column of the input buffer are all zeroes, then processing operations that would otherwise be performed on that column (and the corresponding column of the weight buffer) by the neurons of the DNN module can be skipped. Similarly, the DNN module can determine if all of the values in an entire column of the weight buffer are zero (or another predetermined value or within a range of values). If the values in any column of the weight buffer are all zeroes, then processing operations that would otherwise be performed on that column (and the corresponding column of the input buffer) by the neurons can be skipped, thereby improving throughput and reducing power consumption.

In some embodiments, the DNN module can determine if all of the values in an entire column of the input buffer or an entire column of the weight buffer are a particular value that is close to zero, within a range of specified values, or are all values above or below a specified threshold value. If so, the DNN module can cause the neurons to skip processing of the entire column of values. The particular value, or values, that will cause the neurons to skip the processing of a column of data can be defined other ways in other configurations.

In another embodiment, the DNN module provides functionality for asynchronous neuron processing and operation skipping. In this embodiment, the neurons perform their processing asynchronously, thereby enabling the neurons to skip processing operations more granularly than on a per column basis as in the embodiment described above. Rather, in this embodiment the group partitioner and scheduler can determine whether a single value in a row of the input buffer or the weight buffer comprises a particular value (e.g. zero, a value close to zero, or a value within a range of values). If a single value in a row of the input buffer or the weight buffer comprises the value, then the responsible neuron can skip the processing of that value in both buffers.

In another embodiment, the DNN module provides functionality for asynchronous neuron processing, operation skipping, and cooperative neuron processing. In this embodiment, neurons that complete their processing early as a result of skipping operations in the manner described above can assist other neurons with their processing. For example, and without limitation, a neuron that skips two operations will complete its processing two cycles early. As a result, the neuron can devote two cycles to performing processing operations on behalf of other neurons.

In this embodiment, a combination operation is performed following the completion of processing that transfers the results of the processing operations performed by a neuron to their correct owner using sideband summation. This is accomplished in one embodiment by configuring accumulators as part of a shared memory that is accessible from all of the neurons in a neuron group. At the end of the cycle, a row-wise summation is performed on the partial results to get the final output value for each row in this embodiment. Other types of combination operations, such as max pooling, can be performed in other embodiments.

As discussed briefly above, implementations of the technologies disclosed herein in a DNN processor can skip certain types of processing operations, thereby resulting in higher throughput and lower power consumption as compared to previous solutions. For instance, implementations of the disclosed technologies can skip processing operations involving weight data and other types of data such as, but not limited to, weight data. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 8 is a network diagram illustrating a distributed computing environment in which aspects of the disclosed technologies can be implemented, according to various embodiments presented herein.

DETAILED DESCRIPTION

Figure 1:
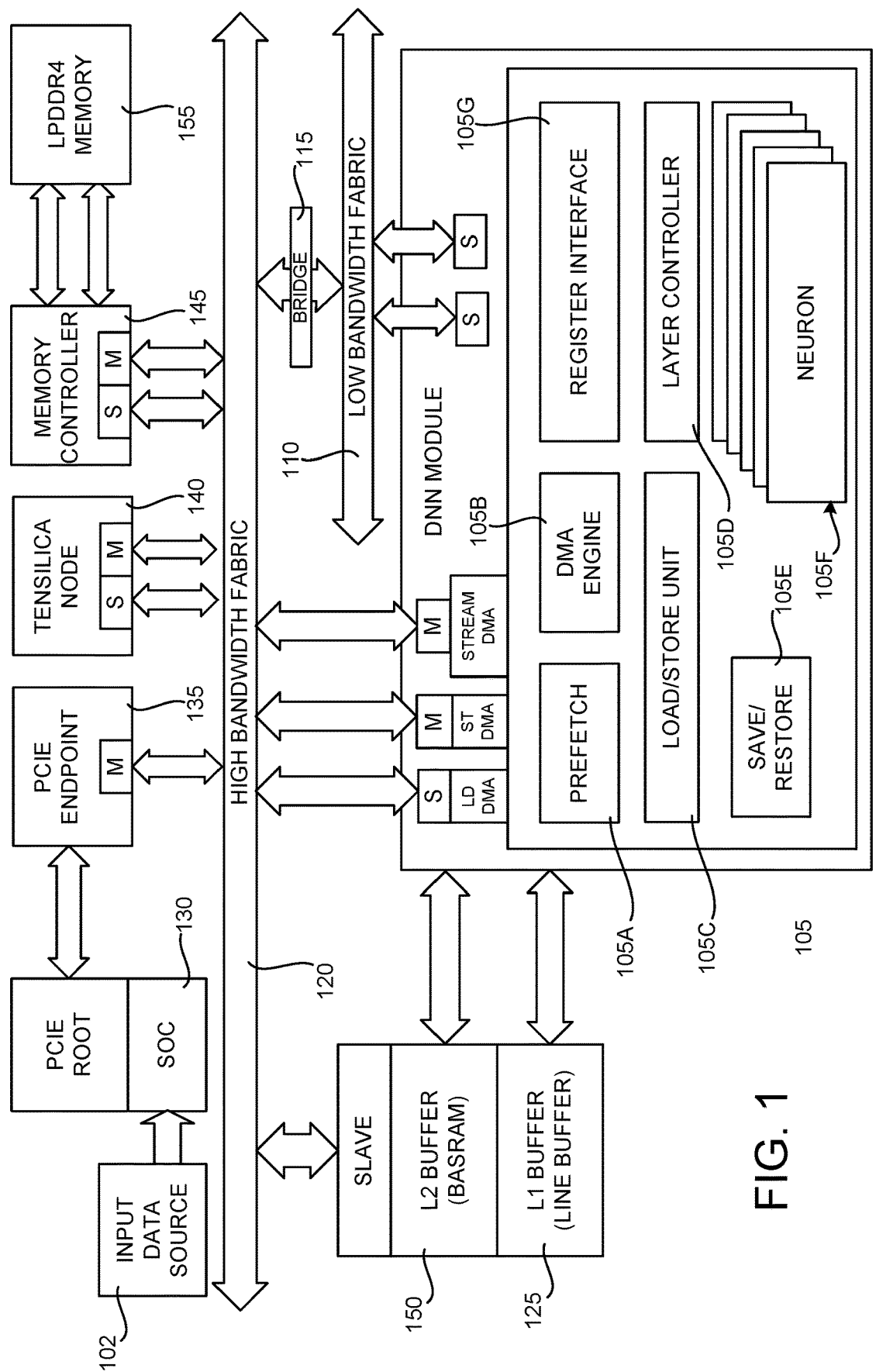
FIG. 1 is a computing architecture diagram that shows aspects of the configuration and operation of a DNN module that implements aspects of the technologies disclosed herein, according to one embodiment.

The following detailed description is directed to a neural network module, or processor, that can reduce power consumption by skipping certain types of processing operations. In particular, the disclosed technologies enable a neural network processor to skip certain types of arithmetic operations performed on input data and weight data, thereby improving throughput and saving power. Other technical benefits not specifically mentioned herein can also be realized through implementations of the disclosed subject matter.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a neural network module, or processor, that can reduce power consumption by skipping certain types of processing operations will be described.

FIG. 1 is a computing architecture diagram that shows aspects of the configuration and operation of a deep neural network ("DNN") module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with a non-linearity applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F are able to maintain context for multiple different active kernels at a time. Each accumulator is capable of being loaded from a read of the BaSRAM 150 (described below). The accumulators can combine their values with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the term activation data is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step function, or another type of function. The activation function allows the neurons 105F to train to a larger set of inputs and desired outputs where classification boundaries are non-linear.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be two main classes of descriptors: memory-to-memory move ("M2M") descriptors; and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operational descriptors specify a specific operation that the neurons 105F should perform on a data structure located in local static random access memory ("SRAM") memory. The operational descriptors are processed in order and are capable of many different layer operations, at least some of which are described herein.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity with a high speed private interface operating at a selected frequency. The L1 buffer 125 can maintain a selected storage capacity that can be split between kernel and activation data. The L1 buffer 125 might be referred to herein as the "line buffer 125," and the L2 buffer 150 might be referred to herein as the BaSRAM 150.

Computational data (i.e. inputs data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise a number of other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 2:
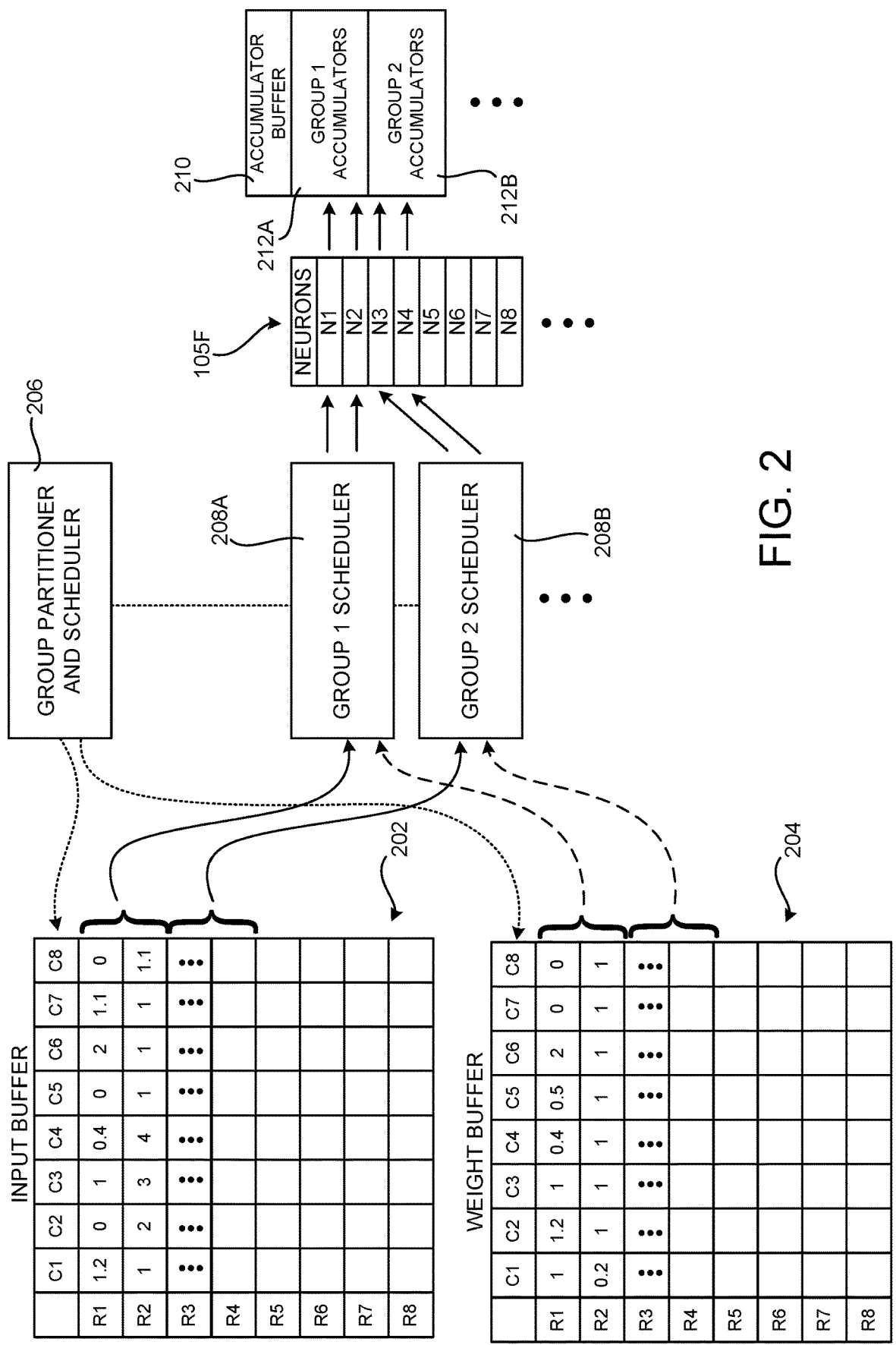
FIG. 2 is a computing architecture diagram showing aspects of the configuration and operation of a neuron buffer, a group partitioner and scheduler, group schedulers, and an accumulator buffer utilized in a DNN module, according to one embodiment.

FIG. 2 is a computing architecture diagram showing aspects of the configuration and operation of a neuron buffer, a group partitioner and scheduler, group schedulers, and an accumulator buffer, according to one embodiment. In particular, FIG. 2 shows aspects of a portion of the DNN module 105 that is used to optimize processing of an artificial neural network in hardware.

As illustrated in FIG. 2 and discussed briefly above, a set of neurons 105F are coupled to two buffers, or line buffers, in one embodiment where one line buffer contains input data (i.e. the input buffer 202) and the other line buffer contains kernel weights (i.e. the weight buffer 204). The input buffer 202 and the weight buffer 204 might be referred to herein collectively as the "neuron buffer." As mentioned above, the line buffers are filled from the BaSRAM 150 by the load/store unit 105C in one embodiment. Data is accumulated in each line buffer until it has reached its predetermined capacity. The line buffer data is then copied to a shadow buffer in some embodiments and presented to the neurons 105F.

Although an input buffer 202 and a weight buffer 204 are illustrated in FIG. 2 and described below, it is to be appreciated that the embodiments disclosed herein can also skip processing operations when only the input buffer 202 is utilized. This might be the case, for example, where the neurons multiply input data by a constant value. In this case, processing of trivial operations, such as when the input value is zero, can be skipped in the manner described below. It is also to be appreciated that processing operations can be skipped when the second buffer (i.e. the weight buffer 204) contains data other than weight data. For instance, the second buffer might also comprise input data. Accordingly, a processing operation involving an input and a weight is only illustrative and the embodiments disclosed herein are not to be limited to processing operations involving input data and weight data.

In the embodiment illustrated in FIG. 2, the input buffer 202 and the weight buffer 204 are organized as an N-by-M matrix, where N is the number of rows, which corresponds to the number of neurons 105F, and M is the number of columns, which corresponds to the "width" of the neuron buffer (i.e. the number of cycles of data that can be made available to a neuron 105F). The columns of the neuron buffer represent the clock cycle in which the data is consumed by the neurons 105F. In the example shown in FIG. 2, the line buffers contain eight columns, which represent eight cycles of data for the neurons 105F to operate on.

In one embodiment there are two copies of each line buffer: a primary copy and a shadow copy. As the memory locations storing the primary copy of the line buffers are being filled, the neurons 105F operate on the shadow copy of the line buffers. Once the memory locations storing the primary copy are filled and the shadow copy of the line buffers is consumed by the neurons 105F, the primary copy data is moved to the shadow copy and the memory locations used to store the primary copy can be filled with the next set of data.

The neurons 105F can process data in the line buffers synchronously or asynchronously in various embodiments disclosed herein. In a synchronous mode of operation, each neuron 105F processes a row from the input buffers, such that one or more columns are selected for processing per clock cycle depending upon the capacity of the neuron. In the synchronous mode of operation, the neurons 105F can be organized into a number of groups equal to the number of neurons 105F.

In an asynchronous mode of operation, a set of neurons 105F work on a set of buffer lines (i.e. rows in the neuron buffer). In order to enable this functionality, a group partitioner and scheduler 206 works to group the buffer lines and present them to each group scheduler 208A and 208B (collectively "the group schedulers 208"). In one embodiment, the group partitioner and scheduler 206 assigns the buffer lines to the group schedulers 208 using a statically assigned (i.e. predetermined) partition pattern. Buffer lines can be assigned to the group schedulers 208 in other ways in other embodiments such as, for example, assigning buffer lines to groups such that each group has a relatively equal workload.

After the buffer lines have been partitioned, the group partitioner and scheduler 206 assigns the buffer lines to a respective group scheduler 208. The group schedulers 208 try to balance the workload within a group of neurons 105F. In the example shown in FIG. 2, neurons N1 and N2 have been assigned to group one. These neurons process data from the first two rows of the neuron buffer. Neurons N3 and N4 have been assigned to group two. These neurons process data from the third and fourth rows of the neuron buffer. The group size is shown as two neurons 105F in FIG. 2 for simplicity, but the group size can be any factor of the total number of neurons 105F.

An accumulator buffer 210 is also utilized in some embodiments. In these embodiments, a group of accumulators 212 are assigned to each group of neurons 105F. In the example shown in FIG. 2, for instance, one group of accumulators 212A has been assigned to the first group of neurons 105F (i.e. neurons N1 and N2) and a second group of accumulators 212B has been assigned to the second group of neurons 105F (i.e. neurons N3 and N4).

Each accumulator 212 is capable of being loaded from a read of the BaSRAM 150. Additionally, the accumulators 212 can combine themselves with the contents of other accumulators assigned to other neurons 105F or neuron groups. As discussed above, by having multiple accumulators 212, the neurons 105F can maintain context for multiple different active kernels at a time.

As also described briefly above, artificial neural networks commonly produce sparse activations. This is particularly true in the case of the ReLu activation function (e.g. ReLu (y=max(x,0))), where a disproportionate (up to 80% in some cases) proportion of activations are zero. Also, certain operations like dilated convolution may involve weight matrices (i.e. convolution filters) that are sparse (i.e. contain many zeroes). These activations, in turn, become inputs for the next layer of the neural network. As a result, many layers of an artificial neural network end up performing trivial operations, where the result of the operations is not influenced by these calculations.

The technologies disclosed herein exploit the tendency of artificial neural networks to produce sparse activations to improve the performance of the neurons 105F and, as a result, to reduce the power consumption of the DNN module 105. Several example embodiments are disclosed below with regard to FIGS. 3-5 for implementing this optimization in the DNN module 105.

Figure 3:
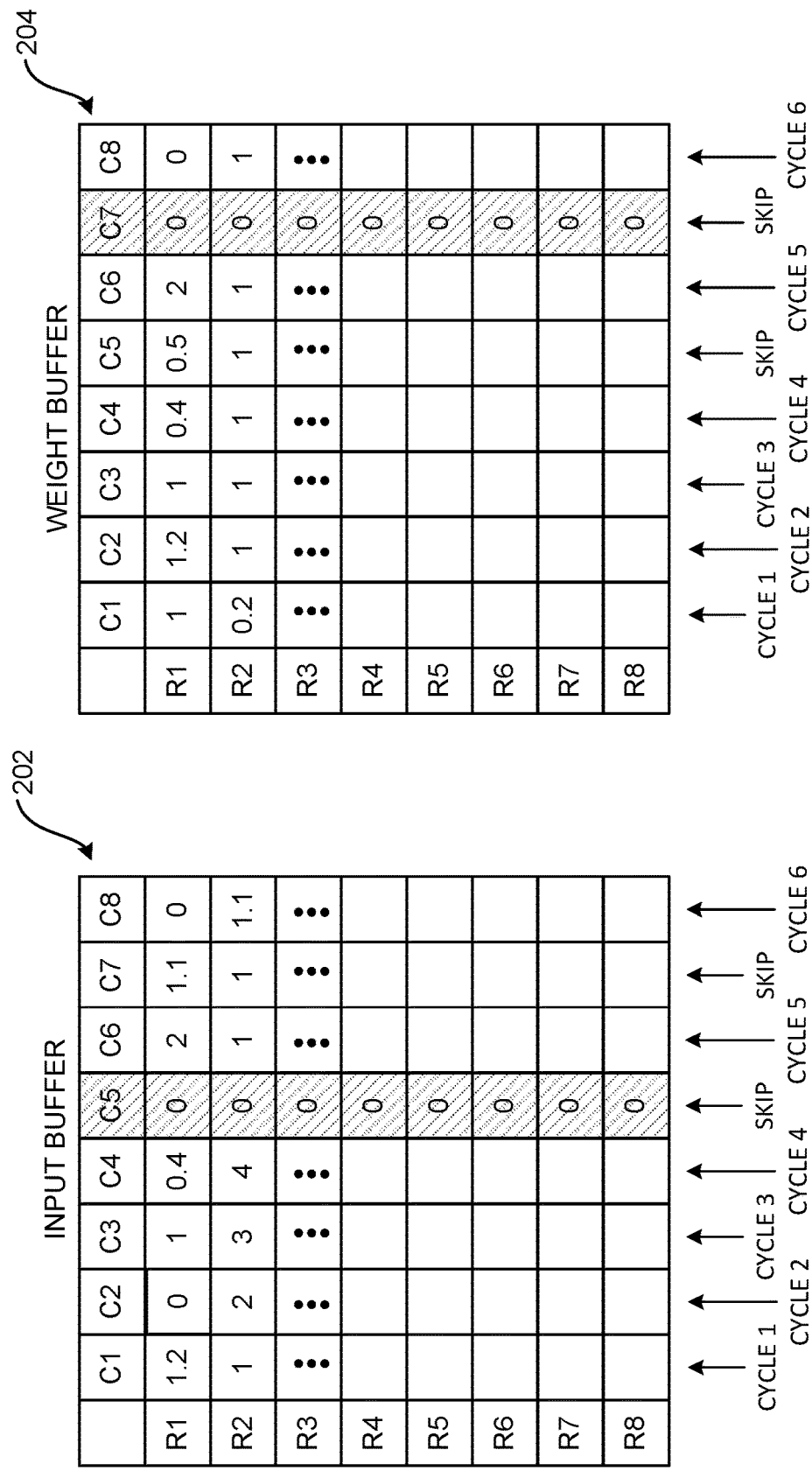
FIG. 3 is a data structure diagram showing aspects of an illustrative neuron buffer in an embodiment disclosed herein that provides full-column operation skipping, according to one embodiment.

FIG. 3 is a data structure diagram showing aspects of an illustrative neuron buffer utilized by the DNN module 105 in an embodiment disclosed herein where the DNN module 105 provides full-column operation skipping. In this embodiment, the DNN module 105 maintains the input buffer 202 and weight buffer 204 such that such that all neurons 105F process the data contained therein synchronously.

The DNN module 105 can also detect whether an entire column of the input buffer 202 or the weight buffer 204 contains only values which, when operated on by the neurons 105F, would not impact the final result. The group partitioner and scheduler 206 performs this function in some embodiments. For instance, the group partitioner and scheduler 206 can determine whether an entire column of the input buffer 202 or the weight buffer 204 contains zeros or any other value (e.g. values close to zero) wherein the resulting operation would not impact the final result. Because operations on these types of values have no impact on the final result, operations on these values can be skipped by the neurons 105F. This mechanism may be referred to herein as "full-column operation skipping" or "column-wise zero skipping."

In some embodiments, the DNN module 105 can detect whether a column of the input buffer 202 or a column of the weight buffer 204 includes all values less than or equal to than a threshold value (e.g. values less than one) or all values within a range of values (e.g. −5 to 5). The value, threshold value, or range of values for which operations are to be skipped is user-definable in some embodiments, thereby enabling a user to define the operations that are to be skipped by the DNN module 105.

In the example shown in FIG. 3, for instance, the group partitioner and scheduler 206 has detected that column C5 in the input buffer 202 contains all zeros. As a result, any operations performed on values in that column by the neurons 105F would have zero as a final result. Consequently, the neurons 105F can skip all processing operations that would have otherwise been performed on the values contained in column C5 of the neuron buffer and the corresponding column C5 of the weight buffer.

In the example shown in FIG. 3, the group partitioner and scheduler 206 has also detected that column C7 of the weight buffer 204 contains all zeros. As a result, any operations performed on values in that column by the neurons 105F would also have zero as a final result. Consequently, the neurons 105F can skip all processing operations that would have otherwise been performed on the values in column C7 of the neuron buffer and the corresponding column of the input buffer.

Because processing of the values in columns C5 and C7 have been skipped in this example, processing of the data loaded in the neuron buffer finishes two cycles faster than expected. By skipping processing operations in this manner, the DNN module 105 can conserve power that would have otherwise been expended on the skipped processing operations. Several other mechanisms for optimizing the operation of the DNN module 105 by skipping neuron 105F processing operations are described below with reference to FIGS. 4 and 5.

Figure 4:
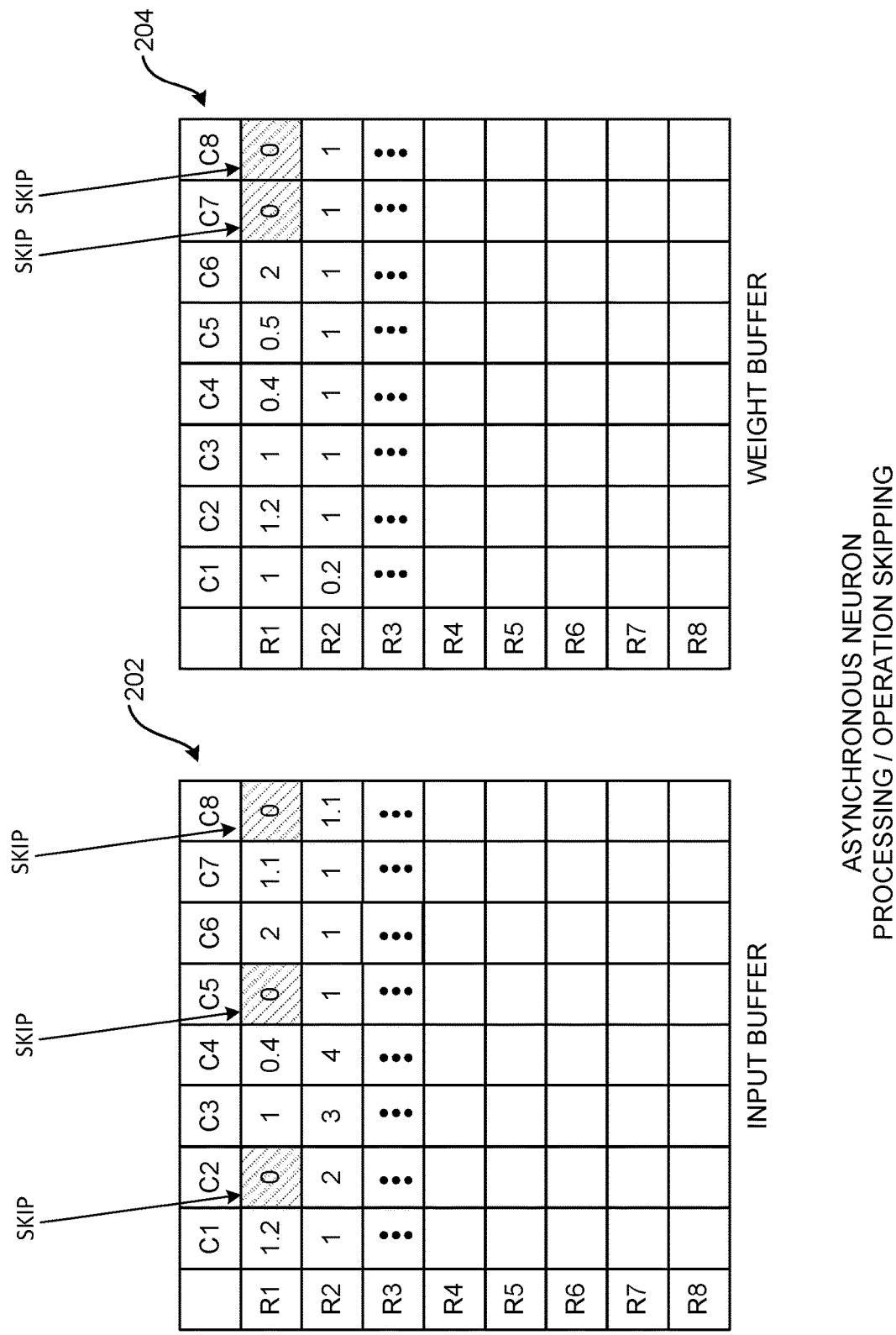
FIG. 4 is a data structure diagram showing aspects of an illustrative neuron buffer in an embodiment disclosed herein where the DNN module provides asynchronous neuron processing and operation skipping, according to one embodiment.

FIG. 4 is a data structure diagram showing aspects of an illustrative neuron buffer in an embodiment disclosed herein where the DNN module 105 provides asynchronous neuron processing and operation skipping. In the embodiment described above with regard to FIG. 3, the neurons 105F in the DNN module 105 process values in the input buffer 202 and the weight buffer 204 synchronously. In other embodiments, however, the neurons 105F in the DNN module 105 can process values in the neuron buffer asynchronously. As will be discussed in detail below, this configuration can result in higher throughput and further power savings as compared to the embodiment discussed above with regard to FIG. 3.

In an asynchronous neuron implementation, the operation of the DNN module 105 can be modified such that a set of neurons 105F work on a set of buffer lines (i.e. rows in the neuron buffer). In particular, the group partitioner and scheduler 206 can group the buffer lines and present the buffer lines to the group schedulers 208 in the manner described above with regard to FIG. 2.

After the buffer lines have been partitioned, they are assigned to a group scheduler 208, which tries to balance the workload within a group in some embodiments. In the example shown in FIG. 5, for example, neuron group 1 (i.e. neurons N1 and N2) works on the first two rows of the neuron buffer. Logic in the group partitioner and scheduler 206 identifies the non-trivial operations (e.g. zero or close to zero weight or input values) in each of the buffer lines in one embodiment.

The decision as to whether a particular column in a particular row needs to be processed can be done on the fly during buffer fill operations and, therefore, can be hidden from subsequent logic (e.g. the neurons 105F). For example, for the first row of the example neuron buffer shown in FIG. 4, using the following formula: IsTrivial(Input_C1)||IsTrivial(Weights_C1), it can be determined that columns C1, C3, C4, and C6 are non-trivial.

For the second row of the example neuron buffer in FIG. 4, all the operations are non-trivial. This information is passed by the group partitioner and scheduler logic 206 to the group one scheduler 208A such that the scheduler can distribute the workload evenly among the neurons 105F in the group (i.e. neurons N1 and N2).

In the example shown in FIG. 4, neuron N1 will work on four operations (i.e. R1C1, R1C3, R1C4, and R1C6) rather than the eight operations that the neuron N1 would have performed if R1C2, R1C5, R1C7 and R1C8 had not been skipped. The neuron N1 can then be powered down for four clock cycles until neuron N2 has finished its processing, thereby saving power.

As shown in FIG. 4, because the neurons N1 and N2 operate asynchronously, the neuron N2 performs eight processing operations. By operating the neurons 105F asynchronously and skipping trivial processing operations on a per row/column basis, additional power savings can be obtained as compared to the embodiment described above with regard to FIG. 3. It should be appreciated that although row R2 is illustrated in FIG. 4 as having no trivial operations for discussion purposes, in practice the number of trivial operations for neighboring neurons is generally correlated.

Figure 5:
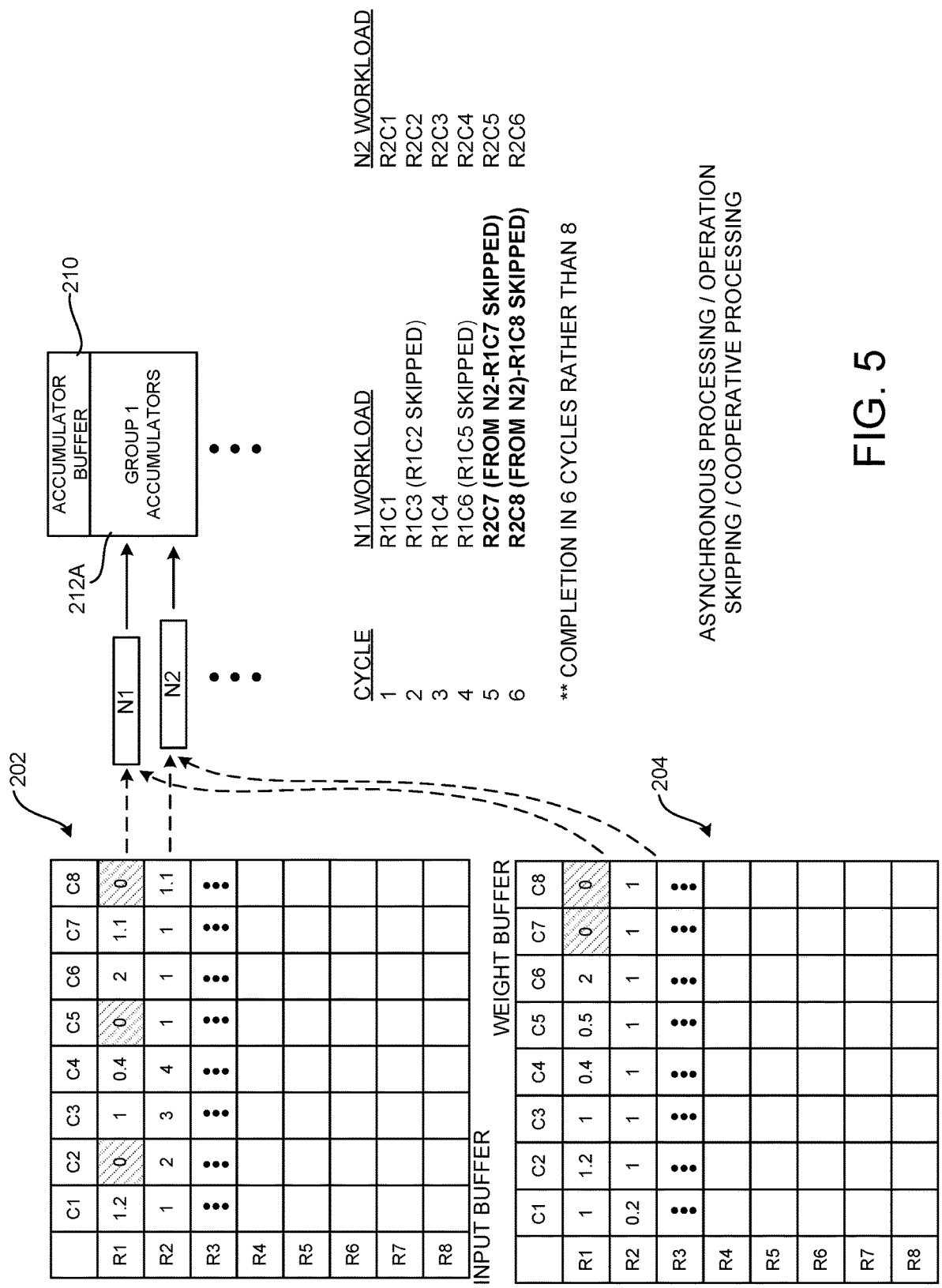
FIG. 5 is a data structure diagram showing aspects of an illustrative neuron buffer in an embodiment disclosed herein where the DNN module provides asynchronous neuron processing, operation skipping, and cooperative neuron processing, according to one embodiment.

FIG. 5 is a data structure diagram showing aspects of an illustrative neuron buffer in an embodiment disclosed herein where the DNN module 105 provides asynchronous neuron processing, operation skipping, and cooperative neuron processing, according to one embodiment. In this embodiment, even further efficiencies can be obtained by enabling neurons 105F that finish processing early to assist other neurons 105F with their assigned processing. In some embodiments, neurons 105F might be dedicated to assisting other neurons 105F with their processing of values in the neuron buffer.

In the example shown in FIG. 5, for instance, neuron N1 will work on four operations (i.e. R1C1, R1C3, R1C4, and R1C6) and will be free for four clock cycles to take over operations from other neurons 105F. In this example, for instance, neuron N1 helps neuron N2 perform two operations (i.e. R2C7 and R2C8). Therefore, this group of neurons 105F finishes its workload in six cycles instead of eight and, accordingly, a gain in throughput is realized as compared to the examples described above.

Because neuron N1 assists neuron N2, a combination operation is performed following the completion of processing that transfers the results of the processing operations performed by neuron N1 to their correct owner (i.e. the neuron N2 in this example) using sideband summation. This is accomplished in one embodiment by configuring the accumulators 212 as part of a shared memory that is accessible from all neurons 105F in a neuron group, where each neuron 104F maintains an array of accumulators 212 equivalent to the number of rows in a neuron group. At the end of the cycle, a row-wise summation can be performed on the partial results to get the final output value for each row. Other mechanisms for transferring the results of processing operations between neurons 105F can be utilized in other embodiments.

Figure 6A:
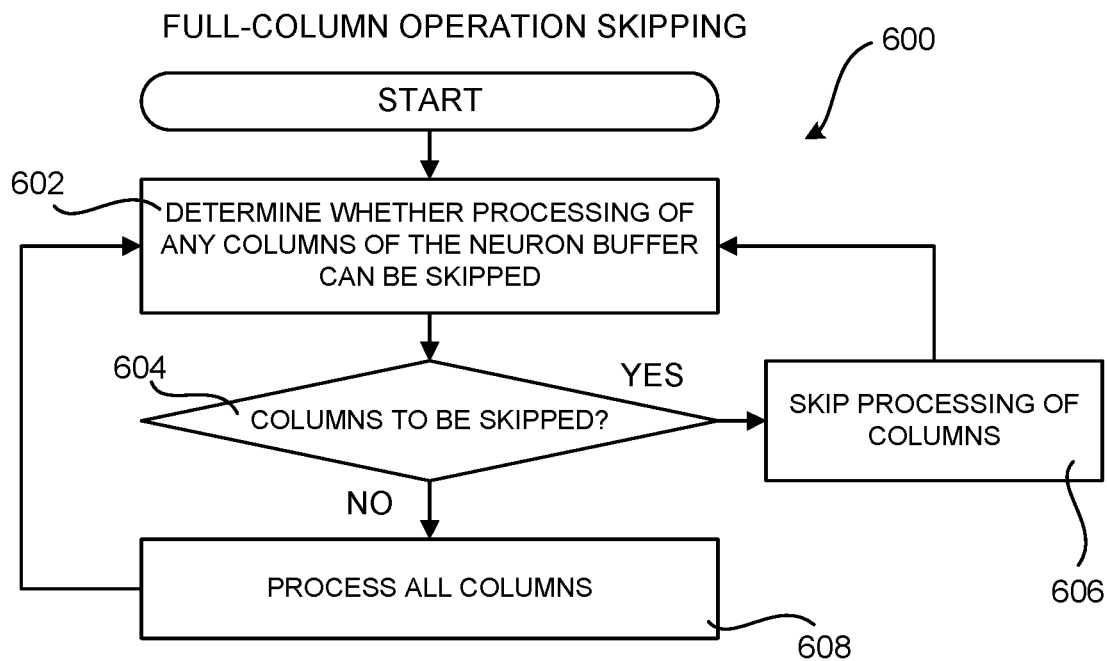
FIGS. 6A-6C are flow diagrams showing several routines that illustrate aspects of the operation of the DNN module described with reference to FIGS. 1-5 for synchronous and asynchronous operation skipping, according to one embodiment disclosed herein.
Figure 6B:
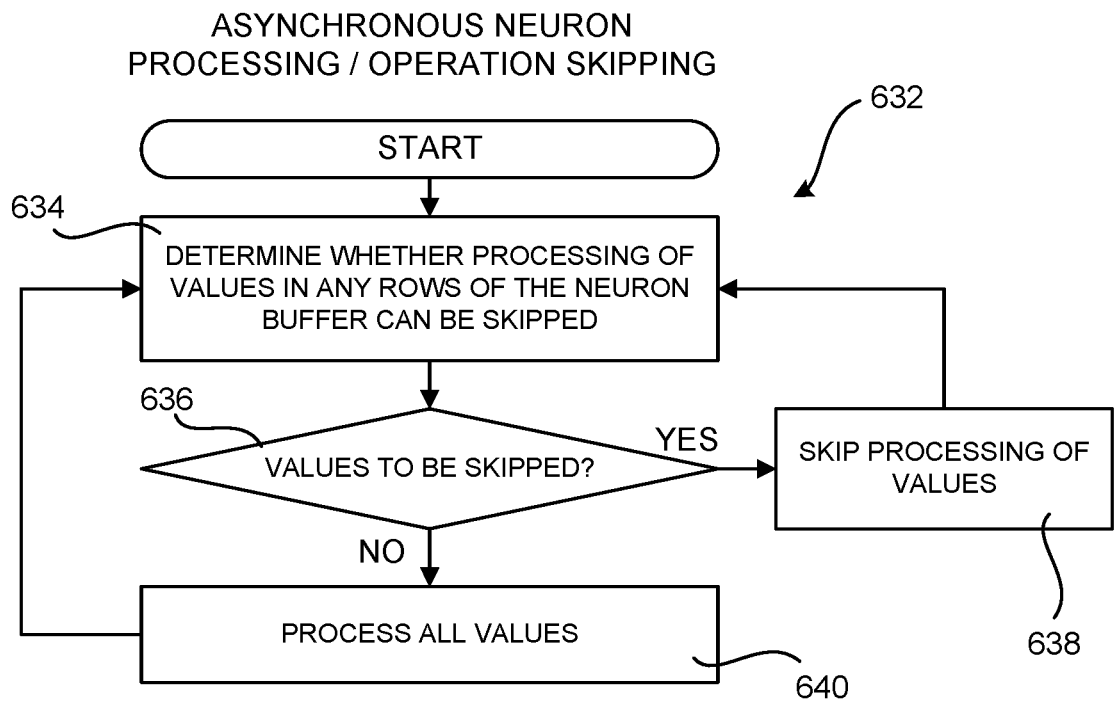
Figure 6C:
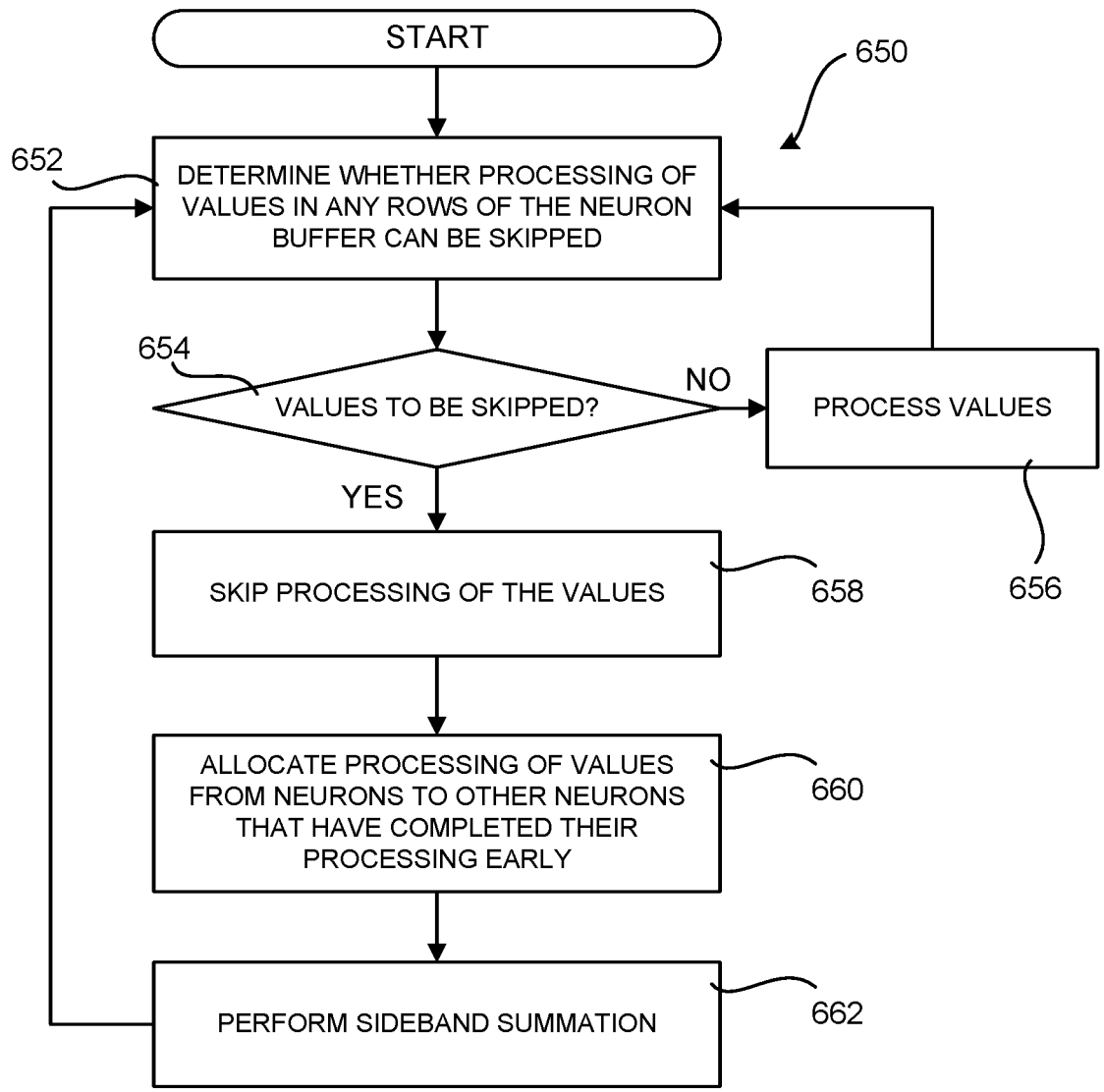

FIGS. 6A-6C are flow diagrams showing several routines that illustrate aspects of the operation of the DNN module described with reference to FIGS. 1-5 for synchronous and asynchronous operation skipping, according to one embodiment disclosed herein. It should be appreciated that the logical operations described herein with regard to FIGS. 6A-6C, and the other FIGS., can be implemented (1) as a sequence of computer implemented acts or program modules running on a computing device and/or (2) as interconnected machine logic circuits or circuit modules within a computing device such as the DNN module 105.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 600 shown in FIG. 6A shows aspects of the embodiment described above for full-column operation skipping. The routine 600 begins at operation 602, where the DNN module 105 determines whether processing of the values in an entire column of neuron buffer can be skipped by the neurons 105F. For example, the DNN module 105 might determine if an entire column of the input buffer 202 or an entire column of the weight buffer 204 are a particular value or within a range of values.

If the values in any column of the input buffer 202 or the weight buffer 204 can be skipped, the routine 600 proceeds from operation 606, where the processing operations that would otherwise be performed on those columns by the neurons 105F of the DNN module 105 are skipped. If no columns of the neuron buffer can be skipped, the routine 600 proceeds from operation 604 to operation 608, where the values in all of the columns of the neuron buffer are processed by the neurons 105F. From operations 606 and 608, the routine 600 proceeds back to operation 602, where further processing in the manner described above may be continued.

The routine 632 shown in FIG. 6B shows aspects of the embodiment described above for asynchronous neuron processing/operation skipping. The routine 632 begins at operation 634, where the DNN module 105 determines whether processing of values in any row/column of the neuron buffer can be skipped. As discussed above, processing of values can be skipped, for instance, if a value in a row of the input buffer or the weight buffer comprises zero or a value close to zero.

If processing of values in the neuron buffer can be skipped, the routine 632 proceeds from operation 636 to operation 638, where processing of those values by the neurons 105F can be skipped. If no values can be skipped, the routine 632 proceeds from operation 636 to operation 640, where all of the values in the neuron buffer are processed by the neurons 105F. From operations 640 and 638, the routine 632 proceeds back to operation 634, where further processing in the manner described above may be continued.

The routine 650 shown in FIG. 6C shows aspects of the embodiment described above for asynchronous processing, operation skipping, and cooperative neuron processing. This routine begins at operation 652, where the DNN module 105 determines whether processing of values in any row/column of the neuron buffer can be skipped. As discussed above, processing of values can be skipped, for instance, if a value in a row of the input buffer or the weight buffer comprises zero or a value close to zero.

If no values can be skipped, the routine 650 proceeds from operation 654 to operation 656, where all of the values in the neuron buffer are processed by the neurons 105F. If, however, processing of at least some of the values in the neuron buffer can be skipped, the routine 650 proceeds from operation 654 to operation 658, where processing of those values by the neurons 105F is skipped.

From operation 658, the routine 650 proceeds to operation 660, where neurons that complete their processing early as a result of skipping operations in the manner described are assigned processing operations from other neurons in the manner described above. The routine 650 then proceeds from operation 660 to operation 662, where a combination operation is performed following the completion of processing that transfers the results of the processing operations performed by a neuron 105F to their correct owner using sideband summation or another mechanism. From operations 662 and 656, the routine 650 proceeds back to operation 652, where further processing in the manner described above may be continued.

Figure 7:
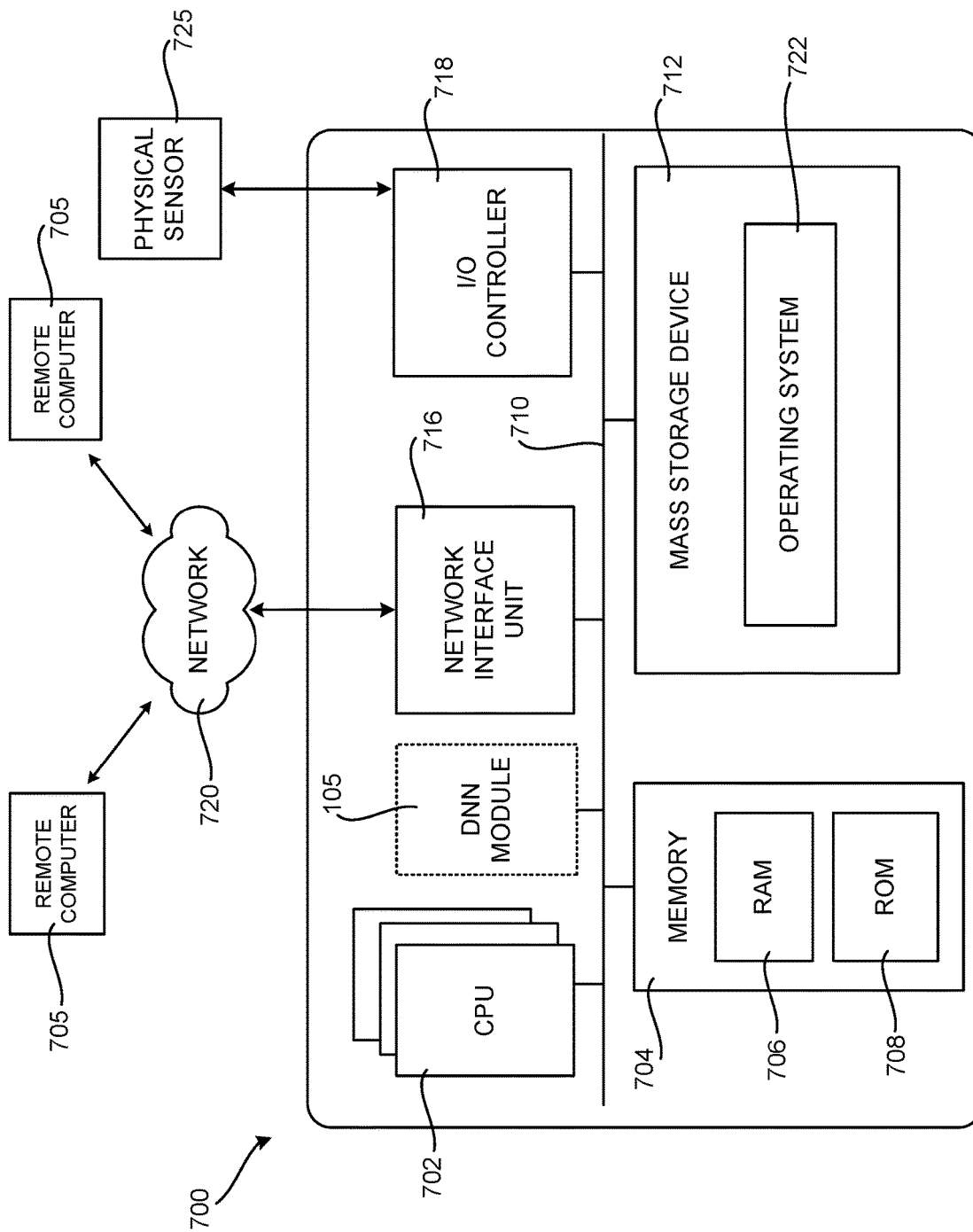
FIG. 7 is a computer architecture diagram showing an illustrative computer hardware and software architecture for a computing device that can act as an application host for the DNN module disclosed herein, according to one embodiment.

FIG. 7 is a computer architecture diagram showing an illustrative computer hardware and software architecture for a computing device that can act as an application host for the DNN module 105 presented herein. In particular, the architecture illustrated in FIG. 7 can be utilized to implement a server computer, mobile phone, an e-reader, a smartphone, a desktop computer, an AR/VR device, a tablet computer, a laptop computer, or another type of computing device suitable for use with the DNN module 105.

The computer 700 illustrated in FIG. 7 includes a central processing unit 702 ("CPU"), a system memory 704, including a random-access memory 706 ("RAM") and a read-only memory ("ROM") 708, and a system bus 710 that couples the memory 704 to the CPU 702. A basic input/output system ("BIOS" or "firmware") containing the basic routines that help to transfer information between elements within the computer 700, such as during startup, can be stored in the ROM 708. The computer 700 further includes a mass storage device 712 for storing an operating system 722, application programs, and other types of programs. The mass storage device 712 can also be configured to store other types of programs and data.

The mass storage device 712 is connected to the CPU 702 through a mass storage controller (not shown) connected to the bus 710. The mass storage device 712 and its associated computer readable media provide non-volatile storage for the computer 700. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 700.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 700. For purposes of the claims, the phrase "computer storage medium," and variations thereof, does not include waves or signals per se or communication media.

According to various configurations, the computer 700 can operate in a networked environment using logical connections to remote computers through a network such as the network 720. The computer 700 can connect to the network 720 through a network interface unit 716 connected to the bus 710. It should be appreciated that the network interface unit 716 can also be utilized to connect to other types of networks and remote computer systems. The computer 700 can also include an input/output controller 718 for receiving and processing input from a number of other devices, including a keyboard, mouse, touch input, an electronic stylus (not shown in FIG. 7), or a physical sensor such as a video camera. Similarly, the input/output controller 718 can provide output to a display screen or other type of output device (also not shown in FIG. 7).

It should be appreciated that the software components described herein, when loaded into the CPU 702 and executed, can transform the CPU 702 and the overall computer 700 from a general-purpose computing device into a special-purpose computing device customized to facilitate the functionality presented herein. The CPU 702 can be constructed from any number of transistors or other discrete circuit elements, which can individually or collectively assume any number of states. More specifically, the CPU 702 can operate as a finite-state machine, in response to executable instructions contained within the software modules disclosed herein. These computer-executable instructions can transform the CPU 702 by specifying how the CPU 702 transitions between states, thereby transforming the transistors or other discrete hardware elements constituting the CPU 702.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 700 in order to store and execute the software components presented herein. It also should be appreciated that the architecture shown in FIG. 7 for the computer 700, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 700 might not include all of the components shown in FIG. 7, can include other components that are not explicitly shown in FIG. 7, or can utilize an architecture completely different than that shown in FIG. 7.

FIG. 8 is a network diagram illustrating a distributed network computing environment 800 in which aspects of the disclosed technologies can be implemented, according to various embodiments presented herein. As shown in FIG. 8, one or more server computers 800A can be interconnected via a communications network 720 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 800B, a gaming console 800C, a smart watch 800D, a telephone 800E, such as a smartphone, a personal computer 800F, and an AR/VR device 800G.

In a network environment in which the communications network 720 is the Internet, for example, the server computer 800A can be a dedicated server computer operable to process and communicate data to and from the client computing devices 800B-800G via any of a number of known protocols, such as, hypertext transfer protocol ("HTTP"), file transfer protocol ("FTP"), or simple object access protocol ("SOAP"). Additionally, the networked computing environment 800 can utilize various data security protocols such as secured socket layer ("SSL") or pretty good privacy ("PGP"). Each of the client computing devices 800B-800G can be equipped with an operating system operable to support one or more computing applications or terminal sessions such as a web browser (not shown in FIG. 8), or other graphical user interface (not shown in FIG. 8), or a mobile desktop environment (not shown in FIG. 8) to gain access to the server computer 800A.

The server computer 800A can be communicatively coupled to other computing environments (not shown in FIG. 8) and receive data regarding a participating user's interactions/resource network. In an illustrative operation, a user (not shown in FIG. 8) may interact with a computing application running on a client computing device 800B-800G to obtain desired data and/or perform other computing applications.

The data and/or computing applications may be stored on the server 800A, or servers 800A, and communicated to cooperating users through the client computing devices 800B-800G over an exemplary communications network 720. A participating user (not shown in FIG. 8) may request access to specific data and applications housed in whole or in part on the server computer 7800A. These data may be communicated between the client computing devices 800B-800G and the server computer 800A for processing and storage.

The server computer 800A can host computing applications, processes and applets for the generation, authentication, encryption, and communication of data and applications, and may cooperate with other server computing environments (not shown in FIG. 8), third party service providers (not shown in FIG. 8), network attached storage ("NAS") and storage area networks ("SAN") to realize application/data transactions.

It should be appreciated that the computing architecture shown in FIG. 7 and the distributed network computing environment shown in FIG. 8 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A neural network module, comprising: a plurality of neurons; a memory device storing a first buffer including first data for processing by the plurality of neurons in the neural network module, and a second buffer storing second data for processing by the plurality of neurons in the neural network module, wherein the first data in the first buffer and the second data in the second buffer are organized into corresponding rows and columns; and wherein the neural network module is configured to determine whether the first data in a column of the first buffer comprises a value or whether the second data in a corresponding column of the second buffer comprises the value, and cause the plurality of neurons to skip processing of the first data and the second data if the first data or the second data comprises the value.

Clause 2. The neural network module of clause 1, wherein the value comprises zero, a range of values, or values above or below a threshold value.

Clause 3. The neural network module of clauses 1 or 2, wherein the first data in the first buffer comprises input data to a neural network.

Clause 4. The neural network module of any of clauses 1-3, wherein the second data in the second buffer comprise weights associated with a neural network.

Clause 5. The neural network module of any of clauses 1-4, wherein the neural network module further comprises a group partitioner and scheduler, and wherein the group partitioner and scheduler determines whether the first data in the column of the first buffer comprise the value or whether the second data in the column of the second buffer comprise the value.

Clause 6. The neural network module of any of clauses 1-5, wherein the plurality of neurons use ReLu ($y=\max(x,0)$) as an activation function for a neural network.

Clause 7. The neural network module of any of clauses 1-6, wherein the plurality of neurons are configured to process the first data and the second data synchronously.

Clause 8. A neural network module, comprising: a plurality of neurons; and a memory device storing a first buffer storing first data for processing by the plurality of neurons in the neural network module, and wherein the neural network module is configured to determine whether data in the first buffer comprises a value, and skip processing of the data in the first buffer if the data comprises the value.

Clause 9. The neural network module of clause 8, wherein the value comprises zero, a range of values, or values above or below a threshold value.

Clause 10. The neural network module of clauses 8 or 9, wherein the first data in the first buffer comprises input data to a neural network.

Clause 11. The neural network module of any of clauses 8-10, wherein the neural network module further comprises a group partitioner and scheduler, and wherein the group partitioner and scheduler determines whether the data located in the first buffer comprises the value.

Clause 12. The neural network module of any of clauses 8-11, wherein the plurality of neurons use ReLu (y=max(x, 0)) as an activation function for a neural network Clause 13. The neural network module of any of clauses 8-12, wherein the plurality of neurons are configured to process the first data and second data in a second buffer asynchronously.

Clause 14. The neural network module of any of clauses 8-13, wherein the plurality of neurons are configured to process the first data and second data in a second buffer synchronously.

Clause 15. A neural network module, comprising: a plurality of neurons; a memory device storing a first buffer storing first data for processing by the plurality of neurons in the neural network module, and a second buffer storing second data for processing by the plurality of neurons in the neural network module, wherein the first data in the first buffer and the second data in the second buffer are organized into corresponding rows and columns; and wherein the neural network module is configured to determine whether data located at a row and column in the first buffer or the second buffer comprises the value, cause a first neuron of the plurality of neurons to skip processing of the data located at the row and column if the data comprises the value, and cause the first neuron of the plurality of neurons to perform at least one operation on behalf of a second neuron of the plurality of neurons responsive to skipping processing of the data located at the row and column.

Clause 16. The neural network module of clause 15, wherein the value comprises zero, a range of values, or values above or below a threshold value.

Clause 17. The neural network module of clause 15 or 16, wherein the neural network module is further configured to combine results of the at least one operation performed by the first neuron on behalf of the second neuron with results of one or more operations performed by the second neuron.

Clause 18. The neural network module of any of clauses 15-17, wherein the first data in the first buffer comprises input data to a neural network and wherein the second data in the second buffer comprise weights associated with the neural network.

Clause 19. The neural network module of any of clauses 15-18, wherein the plurality of neurons use ReLu (y=max (x,0)) as an activation function for a neural network.

Clause 20. The neural network module of any of clauses 15-19, wherein the plurality of neurons are configured to process the first data and the second data asynchronously.

Based on the foregoing, it should be appreciated that a neural network module, or processor, that can reduce power consumption by skipping the performance of certain types of processing operations has been disclosed herein. Although the subject matter presented herein has been described in language specific to processor structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A neural network module, comprising:
a plurality of neurons;
a group partitioner and scheduler; and
a memory device storing
a first buffer storing first data for processing by the plurality of neurons in the neural network module, and
a second buffer storing second data for processing by the plurality of neurons in the neural network module, wherein the first data in the first buffer and the second data in the second buffer are organized into corresponding rows and columns,
wherein the plurality of neurons are configured to process the first data and the second data synchronously whereby one or more of the columns are selected for processing per clock cycle, and
wherein the group partitioner and scheduler is configured to
determine whether the first data in an entire column of the first buffer comprises a predetermined value or range of values,
cause the plurality of neurons to skip processing of the first data and the second data if the first data in the entire column of the first buffer comprises the predetermined value or range of values,
determine whether the second data in an entire column of the second buffer comprises the predetermined value or range of values, and
cause the plurality of neurons to skip processing of the first data and the second data if the second data in the entire column of the second buffer comprises the predetermined value or range of values.

2. The neural network module of claim 1, wherein the predetermined value comprises zero, a range of values, or values above or below a threshold value.

3. The neural network module of claim 1, wherein the first data in the first buffer comprises input data to a neural network.

4. The neural network module of claim 1, wherein the second data in the second buffer comprise weights associated with a neural network.

5. The neural network module of claim 1, wherein the plurality of neurons use ReLu (y=max(x,0)) as an activation function for a neural network.

6. The neural network module of claim 1, wherein the predetermined value or range of values is user-definable.

7. A neural network module, comprising:
a plurality of neurons;
a group partitioner and scheduler; and
a memory device storing
a first buffer storing first data for processing by the plurality of neurons in the neural network module, the first data comprising input data to a neural network,
a second buffer storing second data for processing by the plurality of neurons in the neural network module, the second data comprising weight data for the neural network,
wherein the first data in the first buffer and the second data in the second buffer are organized into corresponding rows and columns, wherein the plurality of neurons are configured to process the first data and the second data synchronously, whereby one or more of the columns are selected for processing per clock cycle, and wherein the group partitioner and scheduler is configured to determine whether the first data in an entire column of the first buffer comprises a predetermined value or range of values, skip processing of the first data in the first buffer if the first data in the entire column of the first buffer comprises the predetermined value or range of values, determine whether the second data in an entire column of the second buffer comprises the predetermined value or range of values, and skip processing of the second data in the second buffer if the second data in the entire column of the second buffer comprises the predetermined value or range of values.

8. The neural network module of claim 7, wherein the predetermined value comprises zero, a range of values, or values above or below a threshold value.

9. The neural network module of claim 7, wherein the plurality of neurons use ReLu ($y=\max(x,0)$) as an activation function for a neural network.

10. The neural network module of claim 7, wherein the predetermined value or range of values is user-definable.

* * * * *